United States Patent
Peng et al.

(10) Patent No.: US 7,439,894 B2
(45) Date of Patent: Oct. 21, 2008

(54) ELECTRONIC APPARATUS FOR CURRENT SOURCE ARRAY AND LAYOUT METHOD THEREOF

(75) Inventors: Kuo-Wei Peng, Taipei (TW); Shian-Sung Shiu, Taipei (TW)

(73) Assignee: Beyond Innovation Technology Co., Ltd., Taipei (TW)

( * ) Notice: Subject to any disclaimer, the term of this patent is extended or adjusted under 35 U.S.C. 154(b) by 0 days.

(21) Appl. No.: 11/559,905

(22) Filed: Nov. 15, 2006

(65) Prior Publication Data
US 2008/0018512 A1    Jan. 24, 2008

(30) Foreign Application Priority Data
Jul. 21, 2006   (TW) ............................. 95126653 A

(51) Int. Cl.
*H03M 1/66* (2006.01)
(52) U.S. Cl. ...................... 341/144; 257/202
(58) Field of Classification Search ................ 341/144, 341/136, 153; 257/341, 202
See application file for complete search history.

(56) References Cited

U.S. PATENT DOCUMENTS

| | | | |
|---|---|---|---|
| 5,497,014 A * | 3/1996 | Momose | 257/205 |
| 5,568,145 A | 10/1996 | Reynolds | |
| 6,140,184 A * | 10/2000 | Dupuy et al. | 438/275 |
| 6,157,333 A | 12/2000 | Louagie et al. | |
| 6,263,479 B1 | 7/2001 | Tajima | |
| 6,317,066 B1 | 11/2001 | Chiang | |
| 6,433,721 B2 * | 8/2002 | Katada | 341/144 |
| 6,710,405 B2 * | 3/2004 | Zommer et al. | 257/341 |
| 6,728,135 B2 * | 4/2004 | Dray et al. | 365/185.03 |
| 6,768,183 B2 * | 7/2004 | Takahashi et al. | 257/511 |
| 6,954,164 B2 | 10/2005 | Lee et al. | |

\* cited by examiner

*Primary Examiner*—Brian Young
(74) *Attorney, Agent, or Firm*—Jianq Chuyun IP Office

(57) ABSTRACT

An electronic apparatus for current source array and the layout method thereof are provided. The current source array includes a low bit group and a plurality of high bit groups. The low bit group has a plurality of current source units and is disposed at a central block of a layout area. In addition, each of the high bit groups has a plurality of current source units respectively disposed at a plurality of peripheral blocks of the layout area.

21 Claims, 7 Drawing Sheets

ELECTRONIC APPARATUS FOR CURRENT SOURCE ARRAY AND LAYOUT METHOD THEREOF

CROSS-REFERENCE TO RELATED APPLICATION

This application claims the priority benefit of Taiwan application serial no. 95126653, filed Jul. 21, 2006. All disclosure of the Taiwan application is incorporated herein by reference.

BACKGROUND OF THE INVENTION

1. Field of the Invention

The present invention relates to an electronic apparatus and the layout method thereof. More particularly, the present invention relates to an electronic apparatus for current source array and the layout method thereof.

2. Description of Related Art

Current digital-to-analog converter (referred to as DAC thereinafter) is generally composed of a plurality of current source units, and the higher the conversion bits thereof are, the more current source units are required. Accordingly, the layout of a DAC is usually very complex, especially the metal connection layout between the current source units are very complicated. Thus, conventionally DAC of lower conversion bits is usually laid out in an array arrangement. The corresponding current source units are arranged horizontally or vertically so as to simplify the layout thereof. However, when the number of current source units is increased, the spacing of some particular current source unit on the chip is increased, and the difference in device characteristics thereof is increased too, which may impair the linearity, which is, differential nonlinearity (DNL) and integral nonlinearity (INL), of the DAC.

FIG. 1 is a schematic block diagram of a conventional current digital-to-analog converter (DAC). An 8-bit DAC is shown in FIG. 1, which can output an analog current according to a digital signal. The binary converter 140 converts the digital signal into control signals SL01~SL15 according to the values of the first 4 bits D0~D3 and sends the control signals to the bit driver 150. The bit driver 150 produces current control signals SDL01~SDL15, SDL01N~SDL15N according to the control signals SL01~SL15 for controlling the low bit current source unit 160 to output current. The low bit current source unit 160 includes 15 sets of current source units which respectively determine whether or not to output according to the control signals SDL01~SDL15 and SDL01N~SDL15N. The 15 sets of current source units in the low bit current source unit 160 can be generally referred to as low bit group.

The current output and conversion mechanism of the last 4 bits D4~D7 of the digital signal is similar to that of the foregoing first 4 bits, and the main difference is that the high bit current source unit 130 includes 15 sets of high bit groups corresponding to the values of the last 4 bits D4~D7. Wherein, each high bit group has 16 current source units. Thus, the output current of the high bit current source unit 130 can be up to 16 times of the current output of the low bit current source unit 160. In other words, the high bit current source unit 130 has 240 current source units. Thus, the layout thereof is very complex and the layout area is very large, accordingly the linearity of the DAC may be reduced due to the affections of process variation and temperature distribution.

FIG. 2 is a circuit diagram of a conventional low bit current source unit. Referring to FIG. 1 as well for following descriptions, the low bit current source unit 160 may include 15 current source units 201~215, and the current source units 201~215 can be generally referred to as a low bit group. The current source units 201~215 determine the paths of the current outputs thereof according to the current control signals SDL01~SDL15 and SDL01N~SDL15N. Thus, 15 groups of independent connection lines have to be disposed repeatedly for respectively controlling the outputs of the current source units 201~215. The high bit current source unit 130 has 240 current source units, and every 16 current source units is considered a high bit group so that the high bit current source unit 130 has 15 high bit groups. The outputs of the 15 high bit groups correspond to the current control signals SDH01~SDH15 and SDH01N~SDH15N. The combined current outputs of the high bit current source unit 130 and the low bit current source unit 160 correspond to an 8-bit digital signal.

Figure 3:
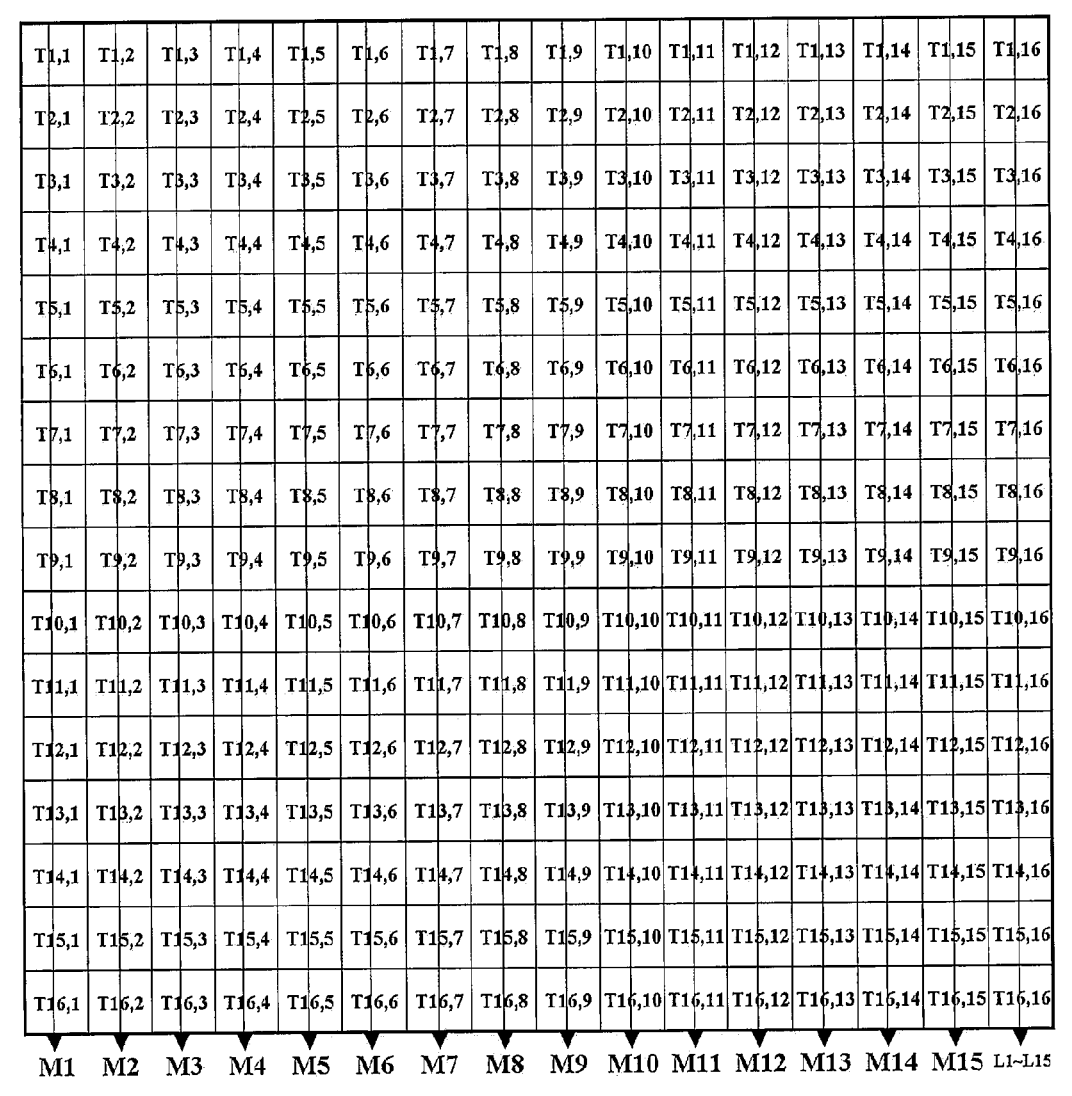

FIG. 3 is a diagram illustrating the layout of a conventional current source array for a current DAC. Referring to FIGS. 1, 2 and 3, the areas T1,16~T16,16 are used for disposing the low bit group (including the current source units L1~L15), the areas T1,1~T16,1 are used for disposing the high bit group M1, the areas T1,2~T16,2 are for disposing the high bit group M2, and so on. Accordingly there are totally 15 high bit groups M1~M15. The low bit group (including the current source units L1~L15) forms the low bit current source unit 160, and the high bit groups M1~M15 form the high bit current source unit 130.

As shown in FIG. 3, the current source units included in the high bit groups M1~M15 and the low bit group (including the current source units L1~L15) are arranged vertically, and even though the complexity of such arrangement is reduced, the affections of process variation and temperature distribution to the circuit are not considered, so that such arrangement can only be applied to the layout of DAC circuit of lower bit.

FIG. 4 is a layout diagram of a conventional transistor (referring to U.S. Pat. No. 6,954,164 B2). The low bit group (including the current source units L1~L15) in this layout method is distributed on the diagonals of the 4 quadrants of the chip, and the distance thereof is very far. Thus, the affection of process variation to the current produced by some particular current source unit in the low bit group (including the current source units L1~L15) is great, so that the conversion linearity of the current source unit is impaired at low bit conversion and the layout thereof is complex.

FIG. 5 is a layout diagram of a conventional transistor array of a DAC (referring to U.S. Pat. No. 6,157,333). The distribution of devices of such layout is too dispersed even though the affections of process variation and temperature distribution to such layout are reduced. Thus, the layout method in FIG. 5 is more complicated. In particular, more complex layout or more metal lines are required for the layout of the connection lines, so that the difficulty in circuit layout is increased greatly.

As described above, even more complex layout method can be adopted in conventional technology to reduce the affections of process variation and temperature distribution to a DAC, the layout thereof is too complex.

SUMMARY OF THE INVENTION

Accordingly, the present invention is directed to provide an electronic apparatus, wherein affections of process variation and temperature distribution to the electronic apparatus are reduced by adjusting the layout method. The foregoing electronic apparatus may be a current source array.

According to an aspect of the present invention, a layout method of electronic apparatuses is provided. The electronic apparatus is divided into a first layout unit and a plurality of second layout units respectively disposed at a central area and a peripheral area of a layout area, so as to reduce the affections of process variation and temperature distribution to the electronic apparatus.

According to another aspect of the present invention, a method of laying out a plurality of electronic apparatuses on a wafer is provided. Layout reference lines are defined appropriately according to various areas of the wafer. The disposition angles of the electronic apparatuses on each area are adjusted according to the corresponding layout reference line, so as to reduce the affections of process variation and temperature distribution to the electronic apparatuses.

According yet to another aspect of the present invention, an electronic apparatus is provided, wherein the disposition angle of the electronic apparatus is adjusted according to the relative position of the layout area whereon the electronic apparatus is disposed to the wafer, so as to reduce the affections of process variation and temperature distribution to the electronic apparatus.

According yet to another aspect of the present invention, a layout method of an electronic apparatus is provided, wherein the devices of an electronic apparatus are disposed symmetrically according to the relative position of the layout area whereon the electronic apparatus is disposed to the wafer, so as to reduce the affections of process variation and temperature distribution to the electronic apparatus.

According yet to another aspect of the present invention, an electronic apparatus for a current source array of a current digital-to-analog converter (DAC) is provided. The current source array is divided into a low bit group and a high bit group, and the low bit group is disposed at the center of the layout area, the current source units in the high bit group are respectively disposed in the peripheral blocks of the layout area with the center of the layout area as the symmetrical center, so as to reduce the affections of process variation and temperature distribution to the conversion features of the DAC.

To achieve aforementioned and other objectives, the present invention provides an electronic apparatus including a first layout unit and a plurality of second layout units. The first layout unit is disposed at the central block of the layout area, and the second layout units are respectively disposed at a plurality of peripheral blocks of the layout area.

According to another embodiment of the present invention, the foregoing electronic apparatus is a current source array including a low bit group and a plurality of high bit groups. The low bit group has a plurality of current source units disposed at the central block of the layout area, and the central block is located at the center of the layout area. The layout area further includes a plurality of peripheral blocks located around the central block, and the peripheral blocks are used for disposing the foregoing current source units of the high bit groups.

To achieve aforementioned and other objectives, the present invention provides a layout method of electronic apparatus. The electronic apparatus includes a first layout unit and a plurality of second layout units. The first layout unit and the second layout units respectively have a plurality of devices. The layout method includes following steps. First, the first layout unit is disposed at the central block of the layout area. Then, the devices of each of the second layout units are respectively disposed at a plurality of peripheral blocks of the layout area.

To achieve aforementioned and other objectives, the present invention provides a method of laying out a plurality of electronic apparatuses on a wafer. The method includes following steps. First, the wafer is divided into N disposition areas with the center of the wafer as reference, and at least one layout reference line is defined in each of the disposition areas according to the position of the disposition area on the wafer. Then, the electronic apparatuses are disposed in the disposition areas, and the disposition angle of the electronic apparatus in each of the disposition areas is adjusted according to the layout reference line of the disposition area.

To achieve aforementioned and other objectives, the present invention provides an electronic apparatus disposed at a layout area. The layout area is divided into a first area and a second area. The foregoing electronic apparatus includes a first layout unit and a plurality of second layout units. The first layout unit has at least one device disposed at the first area. The second layout units are disposed at the second area, wherein each of the second layout units has at least one device. Wherein, the layout area has a base line passing through about the center of the layout area, the first area has a long axis parallel to the base line, and the first area contains the center of the layout area.

To achieve aforementioned and other objectives, the present invention provides a layout method of electronic apparatus. The electronic apparatus includes a first layout unit and a plurality of second layout units. The foregoing first layout unit has a plurality of first devices, and each of the second layout units has a plurality of second devices. The layout method includes following steps. First, a first area of the layout area is determined according to the base line of the layout area, wherein the first area contains the center of the layout area. The first layout unit is disposed at the first area. Next, the second layout units are disposed at other areas of the layout area.

In general, according to the present invention, an electronic apparatus is divided into first layout unit and second layout units respectively disposed symmetrically from the center of a layout area. If an electronic apparatus is to be disposed on a wafer, the disposition angle of the electronic apparatus is adjusted according to the area whereon the electronic apparatus is disposed. The foregoing electronic apparatus may be a current source array, the first layout unit thereof represents current source units of lower bit, and the second layout units thereof represent current source units of higher bit. At disposition, the lower bit current source unit is disposed at the position closer to the center of the layout area.

Accordingly, if the present invention is applied to the current source array of a DAC, the affections of process variation and temperature distribution to the DAC and the layout complexity thereof can be reduced, and moreover, the layout of the current source array can be simplified.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3 is a diagram illustrating the layout of a conventional current source array for a current DAC.

DESCRIPTION OF EMBODIMENTS

Figure 6:
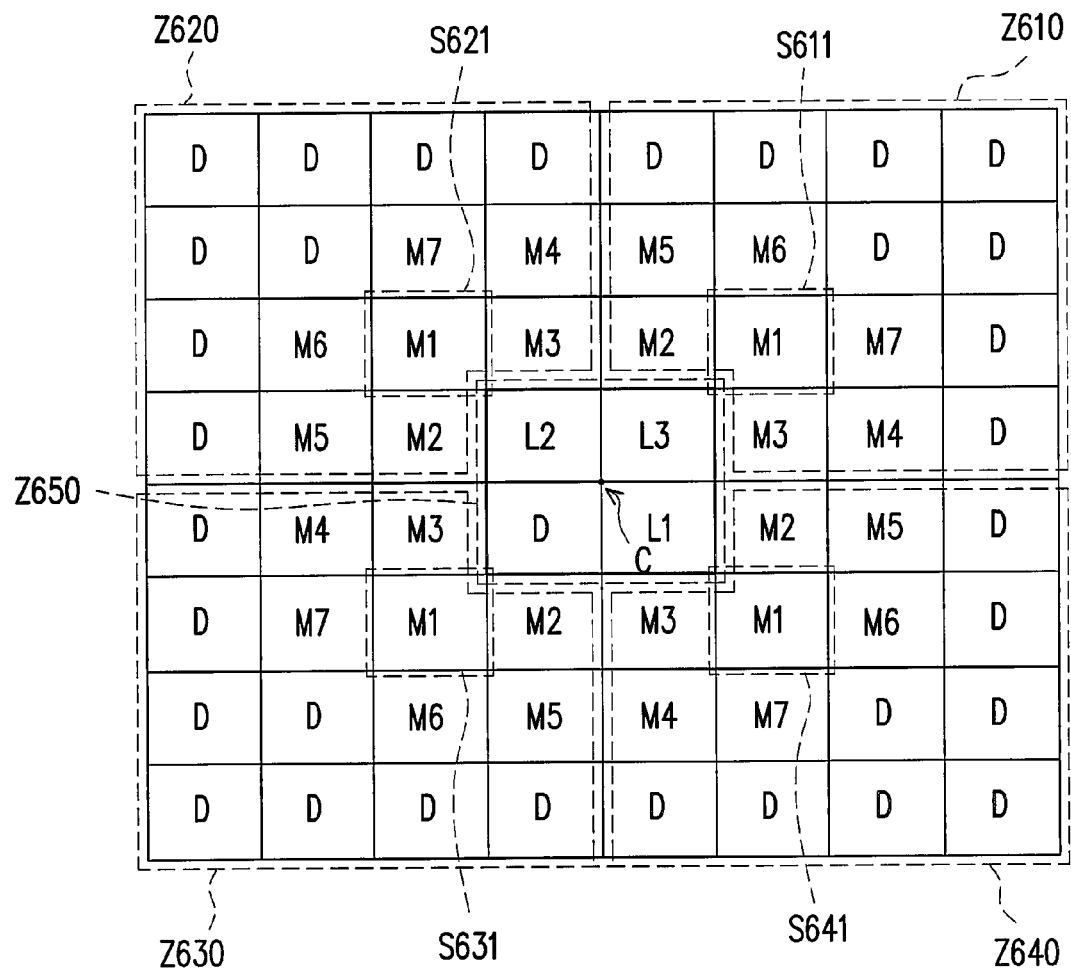
FIG. 6 is a layout diagram of a current source array according to an exemplary embodiment of the present invention.

FIG. 6 is a layout diagram of an electronic apparatus according to an exemplary embodiment of the present invention. In the present embodiment, the electronic apparatus is a current source array suitable for a digital-to-analog converter (DAC). The present embodiment is described with a 5-bit DAC as example.

The DAC can output an analog current according to a digital signal. Wherein, the current output by a low bit group of the DAC corresponds to the least significant bits (LSB) of the digital signal, and the current output by a high bit group of the DAC corresponds to the most significant bits (MSB) of the digital signal. In the present embodiment, LSB represents the first 2 bits of the digital signal, and MSB represents the last 3 bits of the digital signal.

As shown in FIG. 6, in the present embodiment, the current source array is disposed at a layout area 600 which includes a central block Z650 and a plurality of peripheral blocks (in the present embodiment, 4 peripheral blocks Z610~Z640 are described as example). Wherein, the current source array includes a low bit group and a plurality of high bit groups. In the present embodiment, the low bit group is a first layout unit, and the high bit groups are second layout units. The first layout unit is disposed at the central block Z650 of the layout area 600, and the second layout units are respectively disposed at the peripheral blocks Z610~Z640 of the layout area 600.

The central block Z650 is located at the center of the layout area 600 and is used for disposing the low bit group, and the low bit group includes a plurality of current source units L1~L3 disposed symmetrically around the center of the layout area 600. Each of the current source units is a current source circuit. In the present embodiment, the low bit group is responsible for the conversion of the 2 LSBs in the digital signal. Thus, the current source units L1~L3 may be respectively corresponding to the values of the LSB of the digital signal (for example, the current source unit L1 corresponds to 01). As to disposition, the smaller the corresponding value of the current source unit (such as L1, which is lower bit) is, the area closer to the center point C of the layout area 600 the current source unit is disposed at, and the current source units are disposed corresponding to the center point C outwardly.

Besides, if the central block Z650 of the layout area 600 contains a surplus area unused by the low bit group, a dummy cell D is disposed at the surplus area to fill up the remaining area in the central block Z650. The layout of the low bit group can be simplified through the foregoing disposition method. Moreover, since the disposed positions of the current source units L1~L3 are close, the device characteristics thereof are close too, so that the affections of process variation and temperature distribution to the DAC can be reduced.

In the present embodiment, only 3 current source units in the low bit group are used for describing the present invention, however, the number of current source units disposed in the central block Z650 in the present invention is not limited thereto. Besides, the disposition pattern of the present invention is not limited to the disposition of the foregoing current source units L1~L3 as long as the low bit group is disposed at the central block. Other suitable disposition manners should be deduced easily by those having ordinary knowledge of the art therefore will not be described herein.

In addition, in the present embodiment, the high bit groups M1~M7 are responsible for the conversion of the 3 MSBs in the digital signal. The high bit groups M1~M7 correspond to the values of the 3 MSB in the digital signal. Wherein, each of the high bit groups M1~M7 is composed of a plurality of current source units, and in the present embodiment, each of the high bit groups M1~M7 has 4 current source units. In other words, the values of the MSBs and LSBs of the input digital signal are represented with current quantities. The current output by the low bit group corresponds to the LSBs of the digital signal, and the current output by the high bit groups correspond to the MSBs of the digital signal.

As to the disposition of the high bit groups, each of the high bit groups M1~M7 is divided into 4 parts respectively disposed at the peripheral blocks Z610~Z640 symmetrically around the center point C. As shown in FIG. 6, the high bit group M1 is divided into 4 parts respectively disposed in the sub-blocks S611~S641 of the peripheral blocks Z610~Z640, wherein each of the sub-blocks S611~S641 is disposed with a current source unit of the high bit group M1. The positions of the sub-blocks S611~S641 are symmetrical around the center point C. The dispositions of the other high bit groups M2~M7 can be deduced accordingly as shown in FIG. 6, therefore will not be described herein.

Moreover, a plurality of dummy cells D can be further disposed at the peripheries of the high bit groups M1~M7 so as to make the device characteristics of the current source units in the high bit groups M1~M7 after process can be more consistent. In the present embodiment, the dummy cells D may have the same circuit structure as the current source units. Each current source unit of the foregoing low bit group and high bit groups includes a current source circuit, which can be referred to the description of FIG. 2. Certainly, the current source units of the low bit group and the high bit groups may be the same current source circuits or different current source circuits.

Figure 1:
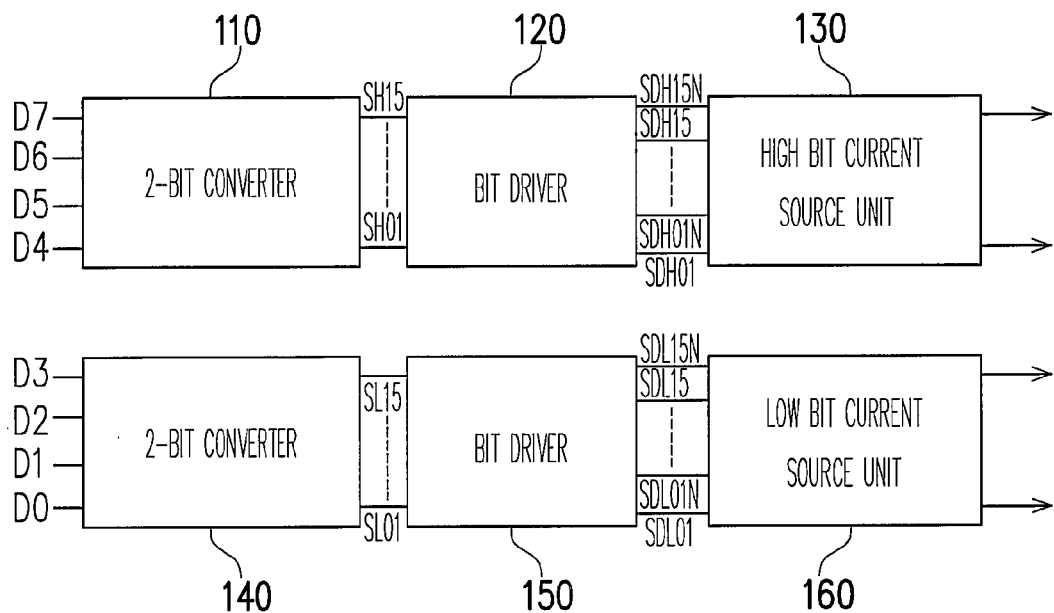
FIG. 1 is a schematic block diagram of a conventional current digital-to-analog converter (DAC).
Figure 2:
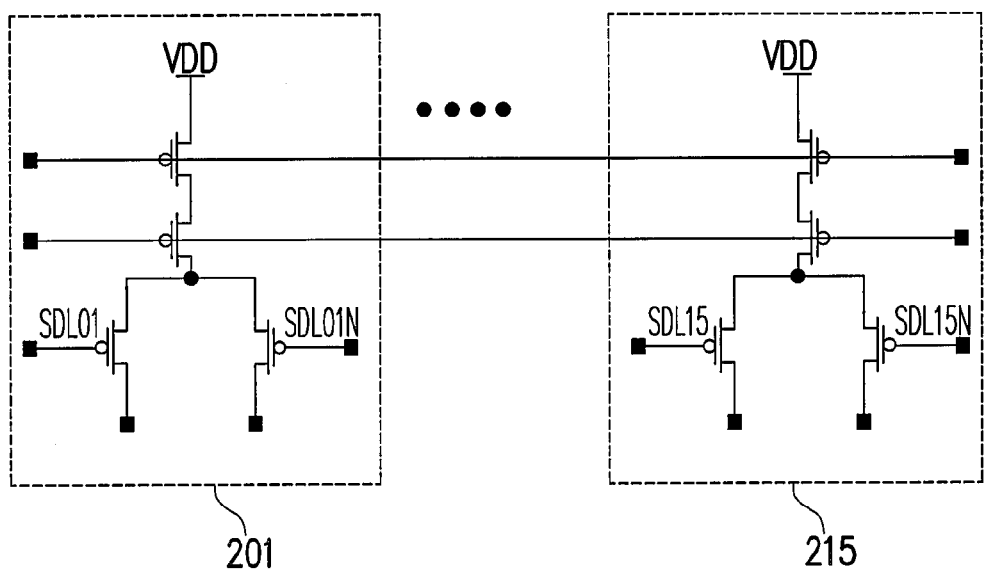
FIG. 2 is a circuit diagram of a conventional low bit current source unit.
Figure 4:
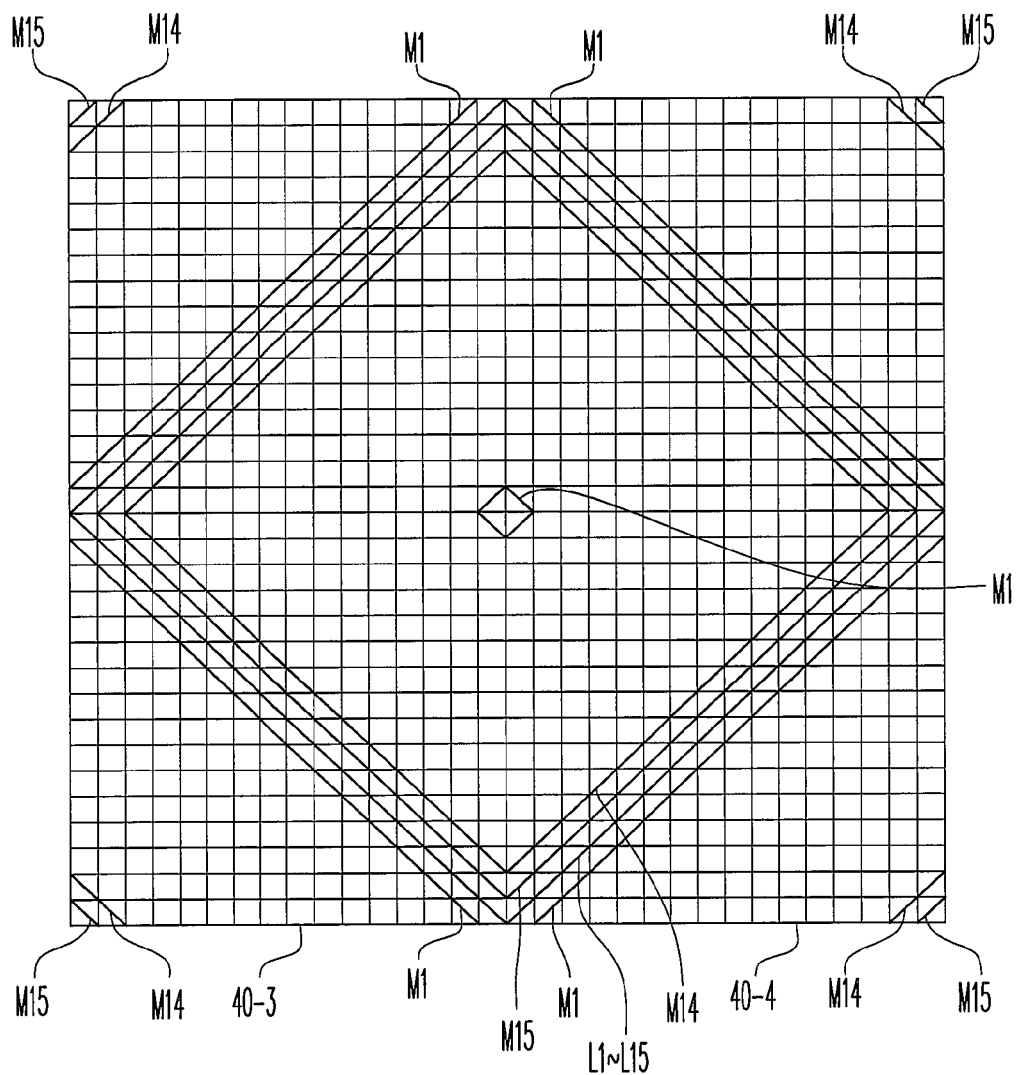
FIG. 4 illustrates the layout of U.S. Pat. No. 6,954,164 B2.
Figure 5:
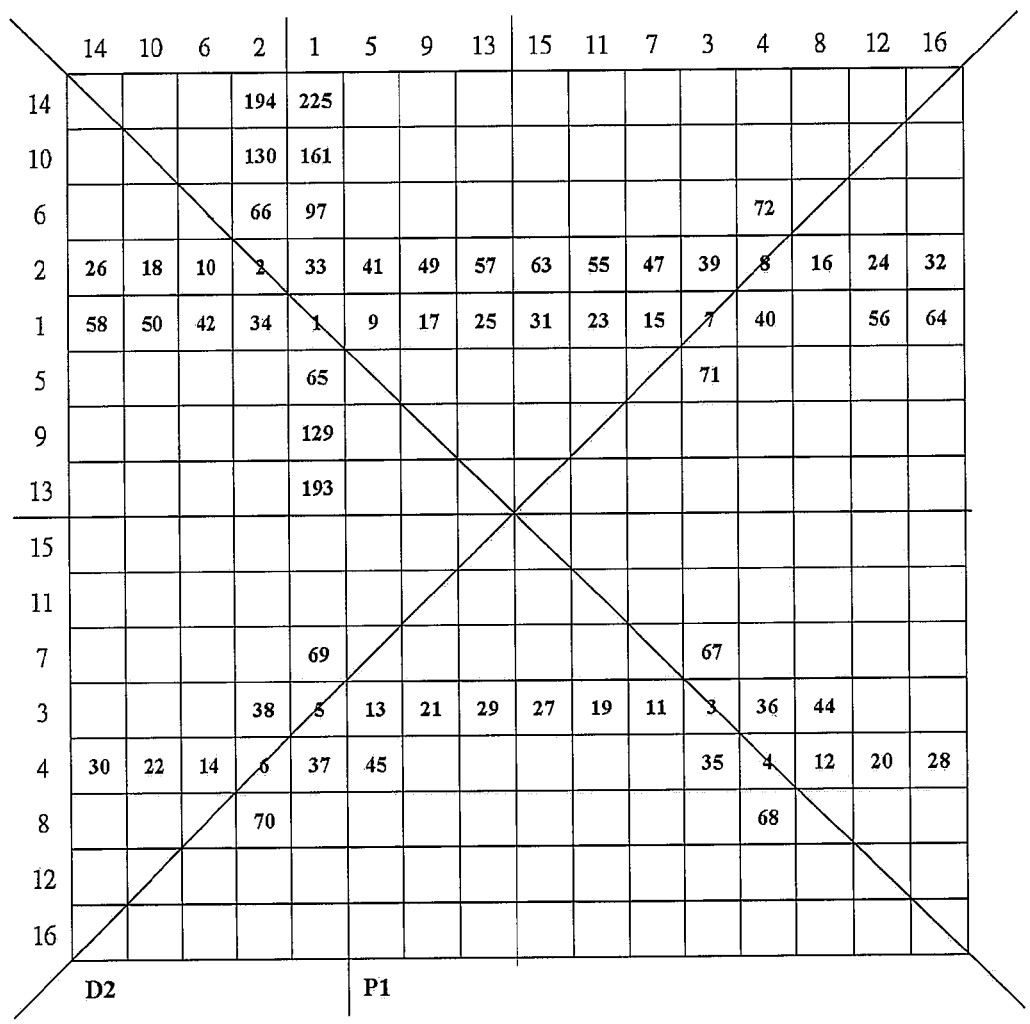
FIG. 5 illustrates the layout of U.S. Pat. No. 6,157,333.

Certainly, according to the present invention the circuit in FIG. 2 is not for limiting the current source circuit in the present embodiment, other suitable current source circuits can be easily deduced by those having ordinary skill in the art based on the present disclosure, therefore will not be described herein.

In the present embodiment, for the dispositions of the high bit groups M1~M7, only the positions of the sub-blocks (the selected sub-blocks have to be located respectively at the 4 peripheral blocks Z610~Z640 and are symmetrical to the center point C) corresponding to the high bit groups are considered, and the correspondences among the high bit groups M1~M15 are not to be considered. Since the high bit groups M1~M7 are all evenly disposed at 4 peripheral blocks, the average values of the device characteristics of the high bit groups M1~M7 should be similar and the output currents thereof should be similar too. Accordingly, the affections of process variation and temperature distribution to circuit output can be reduced.

FIG. 6 illustrates only an embodiment of the present invention, but is not for limiting the disposition manner of the present invention. Wherein, the positions of the high bit groups M1~M7 are exchangeable, and the affections of process variation and temperature distribution can be reduced as well. Other applicable disposition manners should be deduced by those having ordinary knowledge in the art based on the present disclosure therefore will not be described herein.

Besides, in the present embodiment, since the high bit groups M1~M7 are all divided into 4 current source units, the units composing the high bit groups M1~M7 are all the same, which are, 4 current source units. Hierarchy layout can be adopted for increasing the convenience and efficiency of deployment and reducing wiring complexity.

Even though only 3 MSBs and 2 LSBs are used as example in the present embodiment, which are not for limiting the present invention. The technologies of the present invention are also applicable to current source array of different bits (for example, 10 bits). Moreover, the layout method in the present invention is not limited to square layout; instead, the technologies in the present invention can be used for reducing the affections of process variation and temperature distribution to circuit output as long as the layout area has a symmetrical center point.

Besides, the technologies in the present invention are not limited to the layout of a plurality of current source units, instead, which can be applied to other circuit layouts having array structure (for example, a plurality of repeated devices, voltage source array) by only replacing the current source array in the present embodiment with the circuit array or device array to be laid out. Other applications of the present invention should be easily deduced by those having ordinary skill in the art based on the present disclosure, therefore will not be described herein.

Figure 7:
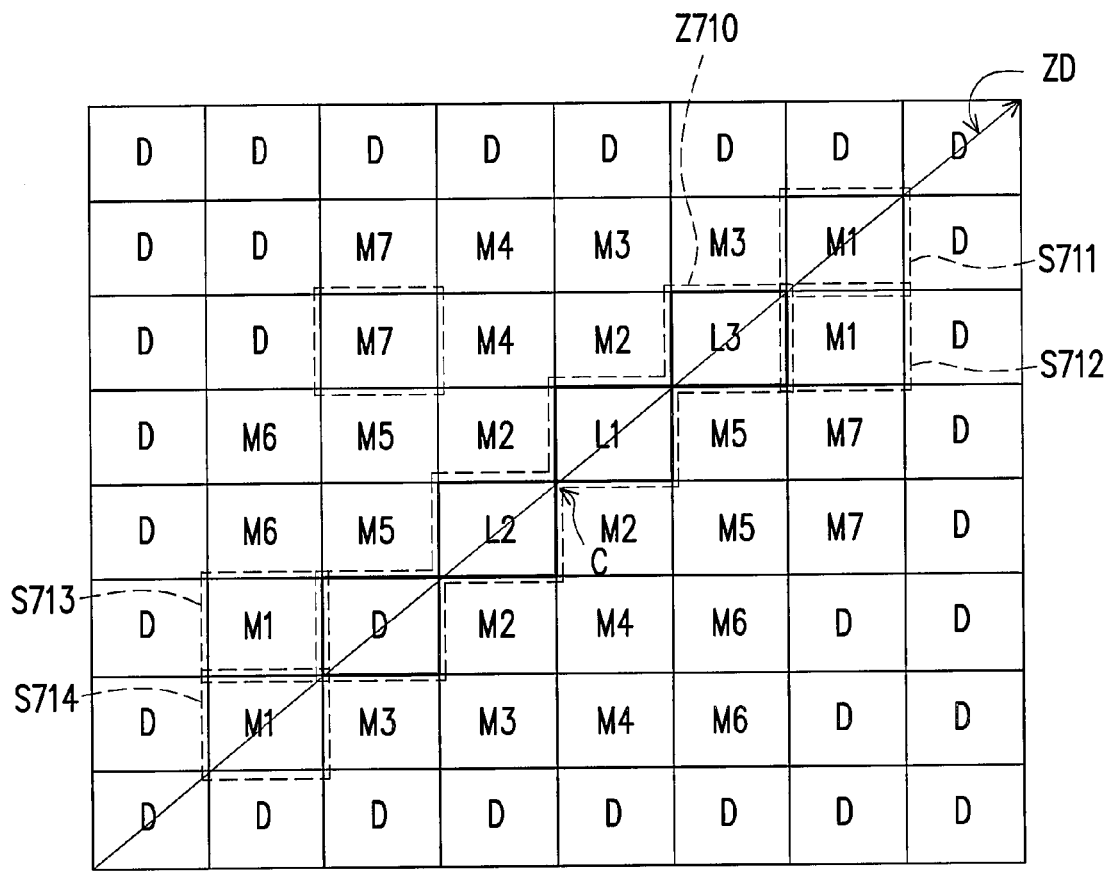
FIG. 7 is a layout diagram of a current source array according to another exemplary embodiment of the present invention.

FIG. 7 is a layout diagram of an electronic apparatus according to another exemplary embodiment of the present invention. The electronic apparatus includes a first layout unit and a plurality of second layout units. The first layout unit has at least one device disposed at a first area Z710. The second layout units are disposed at a second area, wherein each of the second layout units has at least one device.

Similarly, the present embodiment is also described with the electronic apparatus being applied to the current source array of a 5-bit DAC as example. The major difference between the embodiments in FIG. 7 and FIG. 6 is at the disposition manner of the current source units.

In the present embodiment, the layout area 700 is divided into a first area Z710 and a second area, and the layout area 700 has a base line ZD passing through about the center of the layout area 700. In addition, the first area Z710 has a long axis parallel to the base line ZD, and the first area Z710 contains the center point C of the layout area 700. The second area is the remaining area after deducting the first area Z710 from the layout area 700.

Wherein, the first layout unit includes a low bit group, which is the current source units L1~L3, and the second layout units are the high bit groups M1~M7. Please refer to the description of the embodiment in FIG. 6 for the current source units L1~L3 and the high bit groups M1~M7, which will not be described herein. The foregoing devices are current source units.

The first area Z710 is formed according to the base line ZD, and in the present embodiment, the long axis of the first area Z710 is located at the same position with the base line ZD. Moreover, the current source units L1~L3 are disposed in the first area Z710 and are arranged according to the base line ZD.

Besides, if the first area Z710 includes a surplus block unused by the current source units L1~L3, a dummy cell D is disposed in the surplus block.

The high bit groups M1~M7 are respectively disposed at the second area, wherein the second layout units are disposed symmetrically according to the base line ZD. Besides, the high bit group M1 may be further divided into 4 parts respectively disposed at the sub-blocks S711~S714. The other high bit groups M2~M7 are all divided into 4 parts disposed symmetrically according to the base line ZD, as shown in FIG. 7.

In the present embodiment, a plurality of dummy cells D may be further disposed at the layout area 700 except to the high bit groups M1~M7, so as to make the device characteristics of the current source units in the high bit groups M1~M7 after process to be more consistent.

FIG. 7 illustrates only a disposition manner in the present embodiment but is not for limiting the disposition manner of the present invention. It is within the scope of the present invention as long as the first layout unit and the second layout units are arranged according to the base line. Other suitable layout manners should be deduced by those having ordinary knowledge in the art based on the present disclosure therefore will not be described herein.

Figure 8:
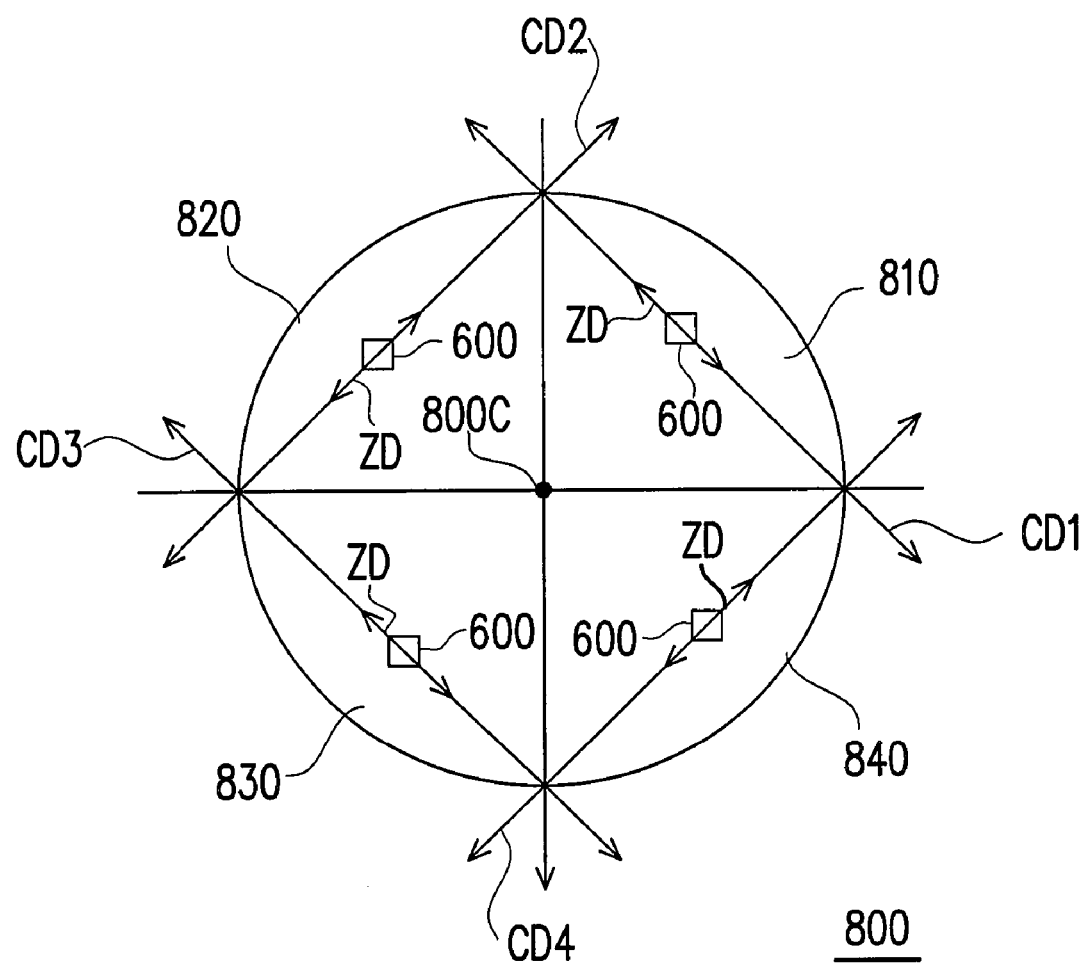
FIG. 8 is a diagram illustrating the deployment layout of a wafer according to yet another embodiment of the present invention.

In another embodiment of the present invention, if a plurality of electronic apparatuses (for example, the electronic apparatuses shown in FIG. 7) are to be laid out on a wafer, the disposition angle of the layout area can be adjusted according to the relative positions of the wafer and the layout area, so as to minimize the process variations between the current source units in the layout area. In the present embodiment, a diagonal can be obtained based on the shape of the layout area and used as the base line ZD of the layout area, and the base line ZD is about perpendicular to the line connecting the center point C of the layout area and the center of the wafer, as the base line ZD shown in FIG. 7. Referring to FIGS. 6, 7, and 8 for the description below, wherein FIG. 8 is a diagram illustrating the deployment layout of a wafer according to yet another embodiment of the present invention.

In the present embodiment, the layout method includes following steps. First, a wafer 800 is divided into N disposition areas with the center point 800C of the wafer 800 as reference, and at least one layout reference line is defined at each disposition area according to the relative position of the disposition area to the center point 800C of the wafer, that is, N layout reference lines are set, wherein N is a positive integer.

Next, the current source arrays are disposed in the disposition areas, and the disposition angle of the current source array in each disposition area is adjusted according to the layout reference line of the disposition area. For example, the disposition angle of the layout area of the current source array is adjusted based on the corresponding layout angle according to the correspondence between the layout area 600 of the current source array and the disposition areas. The present embodiment will be described below with N equal to 4 as example.

As shown in FIG. 8, when N is 4, the center point 800C of the wafer 800 is used as a reference point and 4 points are set on the circumference of the wafer 800 to divide the wafer 800 into 4 disposition areas 810~840 equally, and a layout reference line is determined according to the line connecting the center point 800C of the wafer 800 and the center of the electronic apparatus, wherein the layout reference line is perpendicular to the connection line. In the present embodiment, 4 layout reference lines CD1~CD4 are determined by respectively connecting two adjacent points on the circumference of the wafer 800.

Next, if the layout area 600 is disposed at the disposition area 810, the base line ZD of the layout area 600 (in the present embodiment, the diagonal of the layout area 600 is the base line thereof) is set to be parallel to the layout reference line CD1, if the layout area 600 is disposed at the disposition area 820, the base line ZD of the layout area 600 is set to be parallel to the layout reference line CD2, and so on. The affections of process variation and temperature distribution to the current source array in the layout area 600 can be reduced through such layout method. The layout area 600 in the present embodiment is as shown in FIG. 6, therefore will not be described herein.

If the current source array in FIG. 7 is to be laid out on a wafer 800, the layout angle of the layout area 700 is adjusted according to the layout reference lines CD1~CD4 of the disposition areas 810~840 corresponding to the layout area 700. For example, when the layout area 700 is disposed at the disposition area 810, the base line ZD of the layout area 700 is set to be parallel to the layout reference line CD1, and so on.

In general, according to another aspect of the present invention, a layout method of electronic apparatus is provided. Wherein the electronic apparatus includes a first layout unit and a plurality of second layout units respectively having a plurality of devices. The layout method includes following steps. First, the first layout unit is disposed at a central block of a layout area. Next, the second layout units are respectively disposed at a plurality of peripheral blocks of the layout area.

Wherein, the layout method in the present embodiment may also be applied to the current source array of a DAC. The current source array includes a low bit group and a plurality of high bit groups, wherein the low bit group is the first layout unit, and the high bit groups are the second layout units. Wherein, the low bit group has a plurality of first current source units (and foregoing devices), the high bit groups respectively have a plurality of current source units, and the disposition manner thereof is to divide the layout area into 4 peripheral blocks and a central block with the center point of the layout area as reference, wherein the central block is located at the center of the layout area. The low bit group is disposed at a central block of a layout area, and the second current source units of each high bit group are respectively disposed at a plurality of peripheral blocks of the layout area.

According to yet another aspect of the present invention, a method of laying out a plurality of electronic apparatuses on a wafer is provided. Meanwhile, a layout method for disposing electronic apparatuses symmetrically to a center point by using base lines is provided. The other details of the foregoing layout method have been described in the embodiments as shown in FIGS. 6, 7, and 8, the layout method and implementation thereof in the present embodiment should be understood by those having ordinary knowledge in the art based on the present disclosure, therefore will not be described herein.

In general, in the application of current source array, according to foregoing embodiments, the current source unit of lower bit is disposed at the center of a layout area, and the current source units of higher bits are disposed symmetrically to the center point in the layout area, so as to reduce the electrical affections of process variation and temperature distribution to the current source array of a current DAC.

Even though only the present invention being applied to the current source array of DAC is described in foregoing embodiments, the electronic apparatus in the present invention may also be applied to layout structures of different arrays, such as transistor array, device (capacitor, resistor, or inductor) array, or circuit array. Similarly, the affections of process variation and temperature distribution to the circuit itself can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic apparatus, comprising:
   a first layout unit, disposed at a central block of a layout area; and
   a plurality of second layout units, respectively disposed at a plurality of peripheral blocks of the layout area, wherein the peripheral blocks respectively have a plurality of sub-blocks, wherein the peripheral blocks are disposed symmetrically around the center of the layout area.

2. The electronic apparatus as claimed in claim 1, wherein the electronic apparatus is a current source array, the first layout unit is a low bit group having a plurality of current source units, and the second layout unit is a high bit group having a plurality of current source units.

3. The electronic apparatus as claimed in claim 2, wherein the current source unit has a current source circuit.

4. The electronic apparatus as claimed in claim 2, wherein the current source units of the low bit group are disposed symmetrically around the center of the layout area.

5. The electronic apparatus as claimed in claim 2, wherein if the central block comprises a surplus area, a dummy cell is disposed at the surplus area.

6. The electronic apparatus as claimed in claim 2, wherein the current source units of each high bit group are disposed symmetrically around the center of the layout area.

7. The electronic apparatus as claimed in claim 2, wherein each high bit group is disposed at one of the sub-blocks of the peripheral blocks, and the sub-blocks disposed with high bit groups are disposed symmetrically around the center of the layout area.

8. The electronic apparatus as claimed in claim 2, wherein the current source array is applied to a digital-to-analog converter (DAC).

9. The electronic apparatus as claimed in claim 2, further comprising a plurality of dummy cells disposed at the peripheries of the high bit groups.

10. A layout method for an electronic apparatus, the electronic apparatus comprising a first layout unit and a plurality of second layout units, the first layout unit and the second layout units respectively have a plurality of devices, the layout method comprising:
    disposing the first layout unit at a central block of a layout area; and
    disposing the devices of each of the second layout units at a plurality of peripheral blocks of the layout area respectively, wherein the peripheral blocks respectively have a plurality of sub-blocks.

11. The layout method as claimed in claim 10, wherein the electronic apparatus is a current source array, and the device is a current source unit.

12. The layout method as claimed in claim 10, wherein the peripheral blocks are disposed symmetrically around the center of the layout area.

13. The layout method as claimed in claim 10, wherein in the step of disposing the first layout unit at the central block of the layout area, the devices of the first layout unit are disposed symmetrically around the center of the layout area.

14. The layout method as claimed in claim 10, wherein if the central block comprises a surplus area, a dummy cell is disposed at the surplus area.

15. The layout method as claimed in claim 10, wherein in the step of disposing the devices of each of the second layout units at the peripheral blocks of the layout area respectively, the devices are disposed symmetrically around the center of the layout area.

16. The layout method as claimed in claim 10, wherein in the step of disposing the devices of each of the second layout units at the peripheral blocks of the layout area respectively, each of the second layout units is disposed in one of the sub-blocks of the peripheral blocks, and the sub-blocked disposed with the second layout units are disposed symmetrically around the center of the layout area.

17. The layout method as claimed in claim 10, further comprising:

disposing a plurality of dummy cells at the peripheries of the second layout units.

18. An electronic apparatus, disposed at a layout area, the layout area being divided into a first area and a second area, the electronic apparatus comprising:

a first layout unit, having at least one device, the first layout unit being disposed at the first area; and a plurality of second layout units, disposed at the second area, wherein each of the second layout units has at least one device;

wherein, the layout area has a base line passing through about the center of the layout area, the first area has a long axis parallel to the base line, and the first area contains the center of the layout area.

19. The electronic apparatus as claimed in claim 18, wherein the electronic apparatus is disposed at the layout area of a wafer, and the base line is about perpendicular to a line connecting the centers of the layout area and the wafer.

20. The electronic apparatus as claimed in claim 18, wherein the layout area is disposed at a disposition area of a wafer, and the disposition area has a layout reference line parallel to the base line.

21. The electronic apparatus as claimed in claim 18, further comprising a plurality of dummy cells disposed at peripheries of the second layout units.

* * * * *